United States Patent [19]
Hargraves

[11] 3,870,196
[45] Mar. 11, 1975

[54] HIGH YIELD METHOD OF BREAKING WAFER INTO DICE

[75] Inventor: Don Hargraves, Pepperell, Mass.

[73] Assignee: Laurier Associates, Inc., Littleton, Mass.

[22] Filed: Sept. 28, 1973

[21] Appl. No.: 401,940

[52] U.S. Cl. .................... 225/1, 225/103
[51] Int. Cl. .................... B26f 3/00
[58] Field of Search .................... 227/1, 2, 5, 93, 103

[56] References Cited

UNITED STATES PATENTS

| | | | |
|---|---|---|---|
| 3,040,489 | 6/1962 | Costa | 225/2 |
| 3,206,088 | 7/1965 | Meyer et al. | 225/2 |
| 3,461,537 | 8/1969 | Lotz | 225/2 X |
| 3,537,169 | 11/1970 | Eigman | 225/2 X |
| 3,562,057 | 2/1971 | McAlister | 225/2 |

*Primary Examiner*—Andrew R. Juhasz
*Assistant Examiner*—Leon Gilden
*Attorney, Agent, or Firm*—Wolf, Greenfield & Sacks

[57] ABSTRACT

A semiconductor wafer having crossing sets of parallel grooves in one face is broken into dice by placing the wafer with its scribed face down on a sheet of stretchable material to which the wafer adheres. A resilient mat is disposed under the stretchable sheet. A roller is moved over the upper face of the wafer and applies pressure along the grooves to break the wafer into strips. The sheet is then stretched to move the strips apart while keeping the scribed grooves in alignment. The roller then passes over the strips and applies pressure along the aligned scribed grooves which causes the strips to be broken into dice.

2 Claims, 4 Drawing Figures

HIGH YIELD METHOD OF BREAKING WAFER INTO DICE

This invention relates in general to the separation of scribed thin wafers into a multitude of dice. More particularly, the invention pertains to an improvement upon methods presently employed in the semiconductor industry for breaking wafers of silicon, germanium, or other semiconductor materials into a multitude of dice.

In the processing of semiconductors into useful electronic devices, a large crystal is grown from a molten bath of the semiconductor material. The crystal is sliced into thin wafers and each wafer is subsequently broken into a large number of dice. Each die may then be used as a separate unit by mounting it upon a suitable "header" or upon a suitable base. The die is usually square or rectangular in shape and is made by scribing one side of the wafer with a sharp tool that makes shallow grooves in the wafer which divide the wafer into squares or rectangles. The scribed wafer is then broken along the scribed lines, first in one direction to form "strips" and then in the other direction to break the strips into dice.

Various procedures are now employed in breaking the wafer to obtain the maximum number of usable dice. In one such procedure, the scribed wafer is placed between sheets of filter paper and the paper is soaked with either alcohol or water. A second procedure is to place the scribed wafer on a sheet of a plastic material and heat the plastic sheet until it softens and sticks to the wafer. A third procedure is to place the wafer on a material having a tacky surface to which the wafer adheres. The objective of all three procedures is to keep the dice in place during and after the breaking of the wafer.

After the wafer has been prepared by one of the three foregoing procedures, the wafer is placed with its scribed side down on either a resilient pad or a flexible metal band. A cylinder is then rolled across the upper face of the wafer to cause the wafer to be broken into strips by fracturing along the scribed lines. The roller applies a downward force upon the wafer either by using a heavy steel cylinder or by exerting pressure upon the cylinder as it rolls over the wafer surface. After the wafer is broken along a first direction into strips, the wafer is turned 90° and the strips are broken into dice by again passing the roller over the wafer.

It has been found that some of the dice are rendered unusable in the foregoing procedures because the dice are chipped along the edges. By experiment, it has been ascertained that most of that chipping occurs during the second breaking operation. The chipping occurs mainly during the second breaking operation because following the first breaking operation, the strips, which abut one another, move up and down as the cylinder is rolled across the wafer in the second breaking operation. Because the wafer usually does not fracture along a perfectly straight line, the fracture is jagged to some extent and the motion of the abutting strips causes damage to the edges which are in contact.

The invention resides in an improved method which results in a substantial increase in the yield of usable dice. In essence, the improved method resides in placing the scribed wafer on an adherent plastic film and breaking the wafer into strips in the usual way by rolling a cylinder over the wafer. The plastic film is then stretched to cause the strips to separate. The cylinder is rolled over the wafer in the second direction to break the strips into dice. During this second roll, the strips are still free to move up and down, as in the prior methods, but because the strips are not touching one another, there is no contact along the fracture edges and, consequently, no chipping results from that motion. A further improvement in yield is obtained by maintaining the plastic film under tension as the cylinder is rolled across the wafer during the first breaking operation. Thus, as each strip breaks from the wafer, it is separated from the wafer and is spaced apart from the preceding strip. For the second breaking operation, the plastic film is held under tension to maintain the separation between strips and the plastic film is also stretched in the second direction. The cylinder is then rolled along the wafer in the second direction to break the strips into dice. As each die breaks from its strip, it is pulled away from the strip by stretching of the film. The yield of usable dice is thereby enhanced because of the considerable reduction in dice having chipped edges.

THE DRAWINGS

The invention can be better understood from the following exposition when it is considered in conjunction with the accompanying drawing in which FIG. 1 is a perspective view of a scribed semiconductor wafer on an adherent sheet;

DETAILED DESCRIPTION

Figure 1:
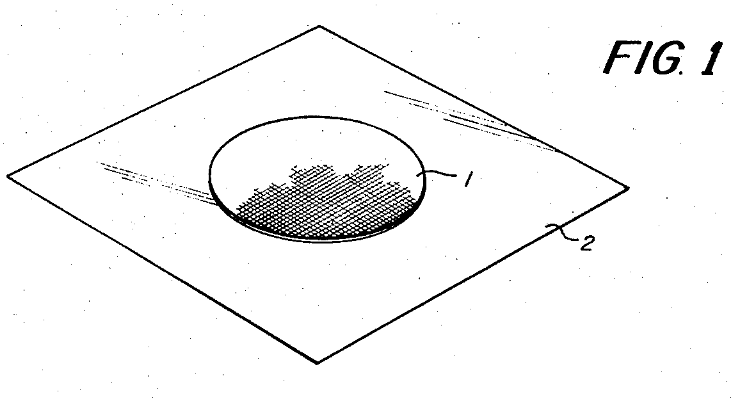

Referring now to FIG. 1, a semiconductor wafer 1 is shown whose underside has been scribed to divide the wafer into a multitude of squares. The wafer is relative thin and is disposed with its scribed side down on an adherent sheet 2. Each square die may have upon it an integrated circuit or may have been processed so that each square can be made into a transistor or other semiconductor device. Because of the processing of the squares, each unit or die is enhanced in value and it is, therefore, highly desirable to break the wafer in such a way that the maximum number of undamaged dice are obtained. In the parlance of the semiconductor industry, the "yield" of a wafer is the usable portion of all the dice obtained from a wafer. Hence, a high yield means that the number of "rejects" or dice not meeting specifications is low in relation to the total number of dice which could be obtained from the wafer in an ideal operation where none of the dice were spoiled or damaged.

In a process now employed to break the wafer into dice, the wafer is mounted, as indicated in FIG. 1, on a sheet 2 having a tacky surface to which the wafer adheres. In a similar process that is also now used, the sheet 2 is a thermoplastic material which softens when heated and sticks to the wafer. The thermoplastic material softens at a relatively low temperature to avoid changing the characteristics of the semiconductor dice. In a third procedure that is sometimes employed, the wafer is sandwiched between sheets of filter paper and the paper is soaked with either water or alcohol. The intent of all three procedures is to hold the dice in place during and after the breaking of the wafer.

Figure 2:
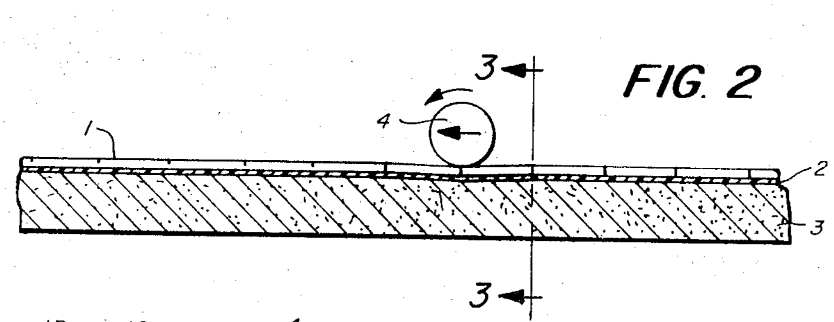
FIG. 2 illustrates the prior art method of breaking the wafer into dice by use of a roller.

Beneath the sheet 2, as depicted in FIG. 2, is disposed a resilient pad 3. By rolling a cylinder 4 across the wafer which applies a downward force upon the wafer's surface, the wafer fractures along the scribed lines. Initially, the wafer is broken into strips by rolling the cylinder so that it is lengthwise in alignment (viz. parallel) with one set of the scribed lines. The strips are held in place by the adherent sheet 2. The cylinder 4 is then rolled across the wafer at right angles to the strips to break the strips into dice. As a consequence of holding the strips and dice in position, some of the dice, at the conclusion of the breaking operation, are unusable because of chipping along the edges. It is believed that edge chipping occurs because the wafer does not fracture along a perfectly straight line and because the fracture is jagged to some extent, the motion of the abutting strips damages the edges which are in contact. Most of the chipping occurs during the second breaking operation because the abutting strips move up and down as the cylinder rolls across the wafer and breaks the dice from the strips. That is, the die and the remainder of its strip tend to pivot around the scribed line as the fracture occurs which releases the die.

A significant increase in "yield" is obtained by separating the strips before the second breaking operation is begun. Inasmuch as a number of strips are simultaneously broken into dice in the second operation, the strips must be separated in such a way that the scribe lines are not disaligned. The invention resides in the process of mounting the wafer on a stretchable sheet to which the wafer, its strips, and its dice are adherent. Preferably, the stretchable sheet is a "plastic" material, such as a vinyl film, having a surface made adhesive by the application of heat to the film. After the film returns to room temperature, the surface provides sufficient adhesion even when the sheet is stretched to prevent disalignment of the strips.

Figure 3:
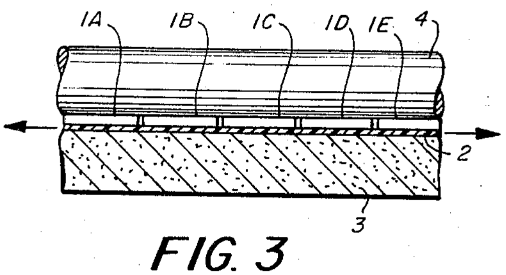
FIG. 3 depicts the separation of strips which occurs in the employment of the invention.

The wafer, in one mode of carrying out the improved process, is placed on a stretchable sheet 2, as depicted in FIG. 1. The sheet, however, is not stretched at this step. The wafer is broken into strips in the usual way by rolling the cylinder 3 across the wafer, as indicated in FIG. 2. After the wafer has been broken into strips, the sheet 2 is stretched by pulling the sheet along its edges, as symbolically indicated by the arrows in FIG. 3. By applying the force evenly along the edges, the sheet stretches and causes the strips 1A, 1B, 1C . . . to separate so that there is a gap between facing edges of adjacent strips. The gap need not be large inasmuch as the object is to eliminate rubbing contact between facing edges. Further, to maintain the scribe lines in alignment, it is preferable to stretch the sheet only enough to eliminate rubbing of the facing edges. If the sheet 2 is elastic, the stretching forces on the sheet must be maintained while the cylinder 4 is rolled over the wafer in the second direction to break the dice from the strips. Inasmuch as the strips are not touching one another, the up and down motion of the strips and the dice, as they flex around the scribe lines, does not cause damage because facing edges of the strips and the dice are not in contact.

Sheet 2 can be of an unelastic material which takes a permanent "set" when it is stretched and hence does not return when the stretching forces are removed. Sheet 2 can also be of a material which can be readily stretched beyond its elastic limit. With such sheets, the stretching forces need not be maintained during the second breaking operation because the strips remain separated when those forces are removed.

Figure 4:
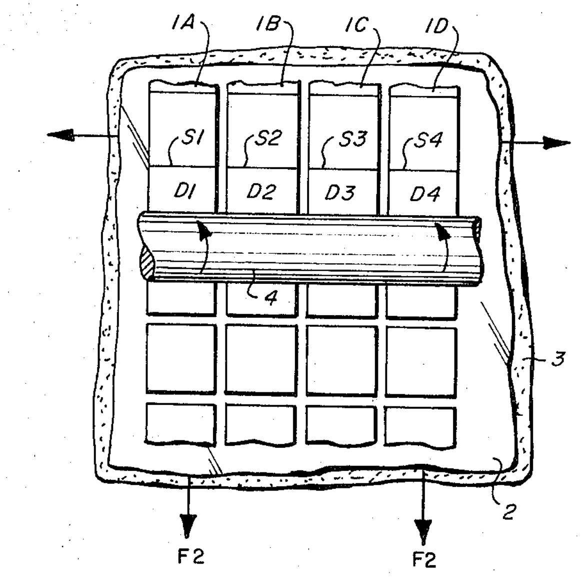
FIG. 4 depicts an additional improvement in separation obtained by stretching in orthogonal directions.

A further improvement in yield can be obtained, by applying stretching forces to the sheet, as indicated by the F2 arrows in FIG. 4, during the second breaking operation. Thus, as each die breaks from its strip, the die is pulled away from the strip by stretching of the sheet. Inasmuch as dice D1, D2, D3, and D4, as depicted in FIG. 4, are to be simultaneously broken from their respective strips, the scribe lines S1, S2, S3, S4, must be maintained in alignment to cause simultaneous fracture along those lines.

While the stretchable sheet and the resilient mat are depicted in the drawings as being separate members, the stretchable sheet and resilient mat may, in actuality, be united in a single member. Further, the cylinder may be replaced by a wedge tool having an elongate edge which is placed over a scribe line and exerts pressure upon the wafer to cause fracturing along the line.

What is claimed is:

1. The method of breaking a wafer into dice wherein the wafer has a face upon which a first set of parallel grooves crosses a second set of parallel grooves, the method comprising the steps of

1. placing the wafer with its scribed face down on a sheet of stretchable material to which the wafer is adherent,

2. providing a resilient mat beneath the stretchable sheet,

3. applying pressure upon the upper face of the wafer along the scribed grooves of the first set to cause the wafer to fracture along the grooves and break into strips,

4. stretching the sheet to cause the facing edges of adjacent strips to be spaced apart with their scribed grooves in alignment,

5. and thereafter applying pressure upon the upper faces of the spaced apart strips along the aligned scribed grooves to break the strips into dice.

2. The method according to claim 1 of breaking a wafer into dice, wherein step 4 is carried out during the performance of step 3, and the method further includes the step of (6) stretching the sheet during the breaking of the strips into dice to cause the dice to pull away from the strips upon breaking therefrom.

* * * * *